(12) United States Patent
Maenpaa (10) Patent No.: US 11,272,295 B2
(45) Date of Patent: Mar. 8, 2022

(54) AUDIO DISPLAY WITH ELECTRO-ACTIVE POLYMER BENDER ELEMENT

(71) Applicant: Huawei Technologies Co., Ltd., Shenzhen (CN)

(72) Inventor: Ossi Maenpaa, Helsinki (FI)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 16/960,607

(22) PCT Filed: Jan. 22, 2018

(86) PCT No.: PCT/EP2018/051395
§ 371 (c)(1),
(2) Date: Jul. 8, 2020

(87) PCT Pub. No.: WO2019/141378
PCT Pub. Date: Jul. 25, 2019

(65) Prior Publication Data
US 2020/0396547 A1    Dec. 17, 2020

(51) Int. Cl.
*H04R 19/02* (2006.01)
*H04R 7/04* (2006.01)
(Continued)

(52) U.S. Cl.
CPC ............. *H04R 19/02* (2013.01); *H04R 1/028* (2013.01); *H04R 7/04* (2013.01); *H04R 7/18* (2013.01);
(Continued)

(58) Field of Classification Search
CPC .......... H04R 19/02; H04R 1/028; H04R 7/04; H04R 7/18; H04R 2307/025;
(Continued)

(56) References Cited

U.S. PATENT DOCUMENTS 6,781,284 B1 * 8/2004 Pelrine .................. F04B 35/045
310/330
7,224,813 B2    5/2007 Hooley et al.
(Continued)

FOREIGN PATENT DOCUMENTS

CN    105096778 A    11/2015
CN    107068710 A    8/2017
(Continued)

OTHER PUBLICATIONS

Swanner, N, "Sound without speakers; Kyocera is changing how we hear each other," Aug. 13, 2013, 7 pages.
(Continued)

*Primary Examiner* — Oyesola C Ojo
(74) *Attorney, Agent, or Firm* — Conley Rose, P.C.

(57) ABSTRACT

An apparatus includes a first support member, a second support member and one or more electro-active polymer members between the first support member and the second support. The one or more electro-active polymer members include a first end configured to be coupled to the first support member, a second end configured to be coupled to the second support member and a middle portion located between the first end and the second end, where the middle portion includes a curved member in a first state of the one or more electro-active polymer members. A curved shape of the one or more electro-active polymer members is configured to create linear movement in a vertical direction, by bending in a curved direction.

20 Claims, 9 Drawing Sheets

(51) Int. Cl.
*H04R 7/18* (2006.01)
*H04R 1/02* (2006.01)

(52) U.S. Cl.
CPC .... *H04R 2307/025* (2013.01); *H04R 2400/11* (2013.01); *H04R 2499/11* (2013.01); *H04R 2499/15* (2013.01)

(58) Field of Classification Search
CPC ............ H04R 2400/11; H04R 2499/11; H04R 2499/15; H04R 7/045; H04R 5/04; H01L 41/193; H01L 41/0926; G10K 9/121; B06B 1/0603
See application file for complete search history.

(56) References Cited

U.S. PATENT DOCUMENTS

| | | | | |
|---|---|---|---|---|
| 8,853,916 | B2* | 10/2014 | Browne | G05G 5/06 310/328 |
| 2003/0095678 | A1* | 5/2003 | Hooley | H04R 17/00 381/353 |
| 2004/0175676 | A1* | 9/2004 | Yang | G09B 21/001 434/112 |
| 2004/0202338 | A1* | 10/2004 | Longbotttom | H04R 17/00 381/190 |
| 2005/0130722 | A1* | 6/2005 | Eriksson | H04M 1/0202 455/575.8 |
| 2005/0269906 | A1* | 12/2005 | Allan | H01L 41/33 310/332 |
| 2006/0138908 | A1* | 6/2006 | Iwase | H01L 41/0472 310/366 |
| 2010/0246862 | A1* | 9/2010 | Ihl | F16F 15/005 381/190 |
| 2013/0044049 | A1* | 2/2013 | Biggs | H01L 41/083 345/156 |
| 2013/0207793 | A1* | 8/2013 | Weaber | G08B 6/00 340/407.2 |
| 2014/0042406 | A1* | 2/2014 | Degner | H05K 1/028 257/40 |
| 2014/0240108 | A1 | 8/2014 | Matthews | |
| 2015/0341714 | A1 | 11/2015 | Ahn et al. | |
| 2016/0072409 | A1* | 3/2016 | Wang | F16D 63/008 310/314 |
| 2017/0019737 | A1* | 1/2017 | Miyoshi | H04R 17/005 |
| 2017/0170255 | A1 | 6/2017 | Ha et al. | |
| 2018/0011576 | A1 | 1/2018 | Ryu | |
| 2018/0108827 | A1 | 4/2018 | Hakkens et al. | |

FOREIGN PATENT DOCUMENTS

| | | |
|---|---|---|
| CN | 206568984 U | 10/2017 |
| CN | 107431121 A | 12/2017 |
| CN | 107591088 A | 1/2018 |
| WO | 03001841 A2 | 1/2003 |
| WO | 2004047192 A2 | 6/2004 |

OTHER PUBLICATIONS

Jed John Ikoba, "Xiaomi Mi Mix 2 To Feature a New Receiver Sound Technology (AAC Actuator)," Apr. 25, 2017, 4 pages.

* cited by examiner

AUDIO DISPLAY WITH ELECTRO-ACTIVE POLYMER BENDER ELEMENT

CROSS-REFERENCE TO RELATED APPLICATIONS

This application is a U.S. National Stage of International Patent Application No. PCT/EP2018/051395 filed on Jan. 22, 2018, which is incorporated herein by reference in its entirety.

TECHNICAL FIELD

The aspects of the present disclosure relate generally to audio devices and more particularly to an audio display for a mobile communication device.

BACKGROUND

Mobile communication devices typically use electro-dynamic speakers for audio reproduction. Challenges associated with these speaker devices include cost, size and limited audio performance caused by small displacement in audio frequencies. Sound holes are also required, which makes the mobile communication device vulnerable to water and dust contamination.

Polymer elements are understood to be able to create mechanical movement with material expansion of the polymer material. With an audio display, electro-active polymer elements can be used to create mechanical vibration, which can be used to create acoustical signals. In mobile communication devices, also referred to herein as mobile devices, in order to create symmetrical upward and downward movement, which is needed to create a non-distorted acoustical signal, separate up and down actuators are needed. This occupies space in these otherwise size critical devices.

Accordingly, it would be desirable to be able to provide an audio display device that addresses at least some of the problems identified above.

SUMMARY

It is an object of the disclosed embodiments to provide an audio display device that maximizes display displacement while minimizing product size. This object is solved by the subject matter of the independent claims. Further advantageous modifications can be found in the dependent claims.

According to a first aspect the above and further objects and advantages are obtained by an apparatus. In one embodiment, the apparatus includes a first support member, a second support member and one or more electro-active polymer members between the first support member and the second support. The one or more electro-active polymer members include a first end configured to be connected to the first support member, a second end configured to be connected to the second support member and a middle portion between the first end and the second end, the middle portion being a curved member in a first state of the one or more electro-active polymer members. The use of a curved polymer member of the disclosed embodiments enables a larger mechanical movement compared to a small physical change in the polymer material. The curved shape creates linear movement in the up and down, or x-direction, by bending in the curved direction, and eliminates the need for individual actuators.

In a possible implementation form of the apparatus according to the first aspect device the second support member is a display member. The aspects of the disclosed embodiments provide an audio display that can be used for example in a mobile communication device. When used as a display, the need for separate speaker devices is eliminated, which saves on space and size. It also eliminates the need for separate sound holes that would be susceptible to water and dust contamination.

In a possible implementation form of the apparatus according to the first aspect as such or the previous possible implementation form, the apparatus has a frame assembly around a perimeter of the apparatus and the one or more electro-active polymer members are disposed adjacent to one or more sides of the frame assembly. The use of the curved polymer member allows the polymer members to be disposed very close to the sides of the apparatus, such as the frame and still provide sufficient movement forces. This is important in size critical devices such as mobile phones where the utilization of space is at a maximum.

In a further possible implementation form of the apparatus an outer surface of the curved member is disposed adjacent to a side of the frame assembly. Positioning the curved member against the frame maximizes display displacement upon expansion of the polymer element.

In a further possible implementation form of the apparatus the one or more electro-active polymer members comprises a polymer layer, the polymer layer including adjacent polymer sections with a slit between adjacent polymer sections. Including transverse air slits or gaps in the polymer layer will minimize bending or expansion of the polymer element in the length direction.

In a further possible implementation form of the apparatus the polymer layer is disposed between a first electrode layer and a second electrode layer. This allows an audio frequency voltage to be applied to the polymer layer to cause mechanical movement in the height direction of the curved polymer member, which is translated into audio.

In a further possible implementation form of the apparatus the one or more electro-active members comprises at least a second polymer layer adjacent to the first polymer layer, the at least one second polymer layer including adjacent polymer sections with a slit between adjacent polymer sections. Multiple polymer layers and electrode layer pairs can be used to apply higher forces as well as optimize bending response time, excursion, force and drive voltage for audio usage.

In a further possible implementation form of the apparatus a first electrode layer of the at least one second polymer layer is connected to the first electrode layer and a second electrode layer of the at least one second polymer layer is connected to the second electrode layer. Multiple polymer layers and electrode layer pairs can be used to apply higher forces as well as optimize bending response time, excursion, force and drive voltage for audio usage.

In a further possible implementation form of the apparatus an adjacent polymer section of the first polymer layer is aligned with an adjacent polymer section of the at least one second polymer layer. Multiple polymer layers and electrode layer pairs can be used to apply higher forces as well as optimize bending response time, excursion, force and drive voltage for audio usage.

In a further possible implementation form of the apparatus a gap is disposed between the frame assembly and the second support member. The gap allows for vibration and movement of the second support member. The second support member, such as a display, is not directly connected to the frame of the apparatus, which allows the second support member to float and vibrate. The floating nature of the second support member relative to the frame allows the second support member to vibrate and move as well as more easily withstand mechanical forces, such as when the apparatus is dropped to the floor.

In a further possible implementation form of the apparatus the one or more electro-active polymer members are configured to cause the second support member to move in a first direction in a second state of the one or more electro-active polymers. The aspects of the disclosed embodiments allow the polymer element to bend and change curvature and pump the second support member up and down to generate audio sounds.

In a further possible implementation form of the apparatus the one or more electro-active polymer members comprise at least a first electro-active polymer member disposed along a first side of the frame assembly; at least a second electro-active polymer member disposed along a second side of the frame assembly, at least a third electro-active polymer member disposed along a top side of the frame assembly; and at least a fourth electro-active polymer member disposed along a bottom side of the frame assembly. Placing the polymer members along each of the sides of the apparatus provides for non-distorted audio and can enable selective use of the different polymer members. In this manner, audio can be generated from any one or more of the polymers members.

In a further possible implementation form of the apparatus, the at least first electro-active polymer member comprises a lower electro-active polymer member and an upper electro-active polymer member, with a gap between the lower and upper electro-active polymer element and wherein the at least second electro-active polymer member comprises a lower electro-active polymer member and an upper electro-active polymer member with a gap between the lower and upper electro-active polymer element. The gap provides a hinge area along an area of the gap, which allows for the different ends of the polymer members to be vibrated individually. This can allow for generating audio from one or more of the bottom and top portions of the display, such as to create stereo audio.

In a further possible implementation form of the apparatus the lower electro-active polymer member and the upper electro-active polymer member of the at least first electro-active polymer member are symmetrically arranged with the lower electro-active polymer member and the upper electro-active polymer member of the at least second electro-active polymer member. The symmetrical arrangement enables symmetrical mechanical movement of the second substrate or display to produce non-distorted audio.

In a further possible implementation of the apparatus, the apparatus is a mobile communication device. The aspects of the disclosed embodiments provide an audio display device for a mobile communication device. This eliminates the need for separate loudspeakers. Sound holes are also not required, which protects against dust and water, and directs the sound toward the user from the front of the device. The floating nature of the display according to the aspects of the disclosed embodiments also provides further protection against damage to the display due to impact, such as when the mobile communication device is dropped.

According to a second aspect, the above and further objects and advantages are obtained by a method for generating audio in a device. In one embodiment, at least one electro-active polymer member is connected between a first support member and a second support member of the device; and the at least one electro-active polymer member is electrically activated and deactivated to generate the audio, wherein the at least one electro-active polymer member comprises: a first end configured to be connected to the first support member; a second end configured to be connected to the second support member; and a middle portion between the first end and the second end, the middle portion comprising a curved member in a first state of the at least one electro-active polymer member. The use of the curved polymer member of the disclosed embodiments enables a larger mechanical movement compared to a small physical change in the polymer material. The curved shape promotes linear movement in the z-direction by bending in the curved direction, and eliminates the need for individual actuators.

In a possible implementation form of the method according to the first aspect as such the at least one electro-active polymer member comprises at least a first electro-active polymer member disposed adjacent to a first side of the device; at least a second electro-active polymer member disposed on a second side of the device, at least a third electro-active polymer member disposed along a top side of the device and at least a fourth electro-active polymer member disposed along a bottom side of the device. The method further comprises selectively activating one or more of the first, second third and fourth electro-active polymer member to generate the audio. Placing the polymer members along each of the sides of the apparatus provides for non-distorted audio and allows for selective activation of the one or more polymer members to generate the audio and produce different audio effects such as stereo.

These and other aspects, implementation forms, and advantages of the exemplary embodiments will become apparent from the embodiments described herein considered in conjunction with the accompanying drawings. It is to be understood, however, that the description and drawings are designed solely for purposes of illustration and not as a definition of the limits of the disclosed invention, for which reference should be made to the appended claims. Additional aspects and advantages of the invention will be set forth in the description that follows, and in part will be obvious from the description, or may be learned by practice of the invention. Moreover, the aspects and advantages of the invention may be realized and obtained by means of the instrumentalities and combinations particularly pointed out in the appended claims.

BRIEF DESCRIPTION OF THE DRAWINGS

In the following detailed portion of the present disclosure, the invention will be explained in more detail with reference to the example embodiments shown in the drawings, in which.

DETAILED DESCRIPTION OF THE DISCLOSED EMBODIMENTS

Figure 1:
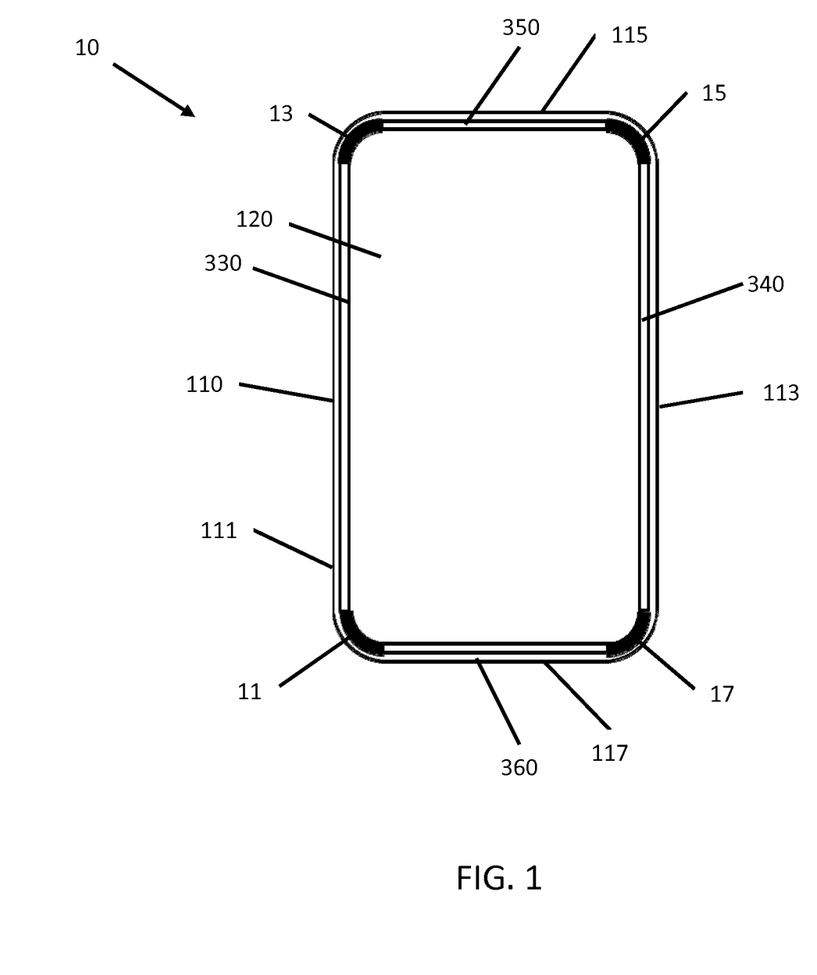
FIG. 1 illustrates a front view of an exemplary apparatus incorporating aspects of the disclosed embodiments.

Referring to FIG. 1 there can be seen a front view of an exemplary apparatus 10 incorporating aspects of the disclosed embodiments. The aspects of the disclosed embodiments are directed to an apparatus 10 that includes an audio display with an electro-active polymer element or device that is configured to generate audio sound for or from the apparatus. The audio display can be implemented in an apparatus 10, such as for example, a mobile communication device. Movement is created in the polymer element, which generates mechanical vibration of the display member of the apparatus 10 that is translated into audio sounds.

Figure 2:
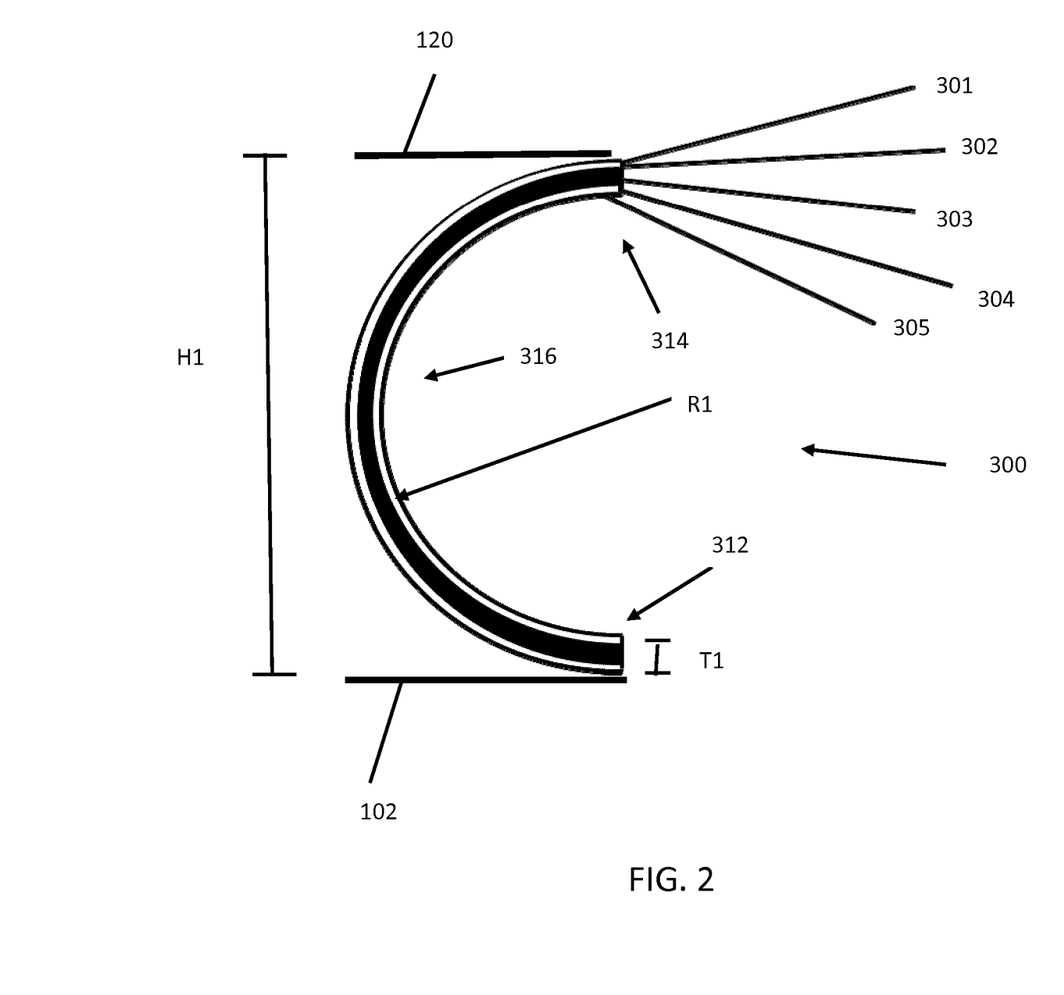
FIG. 2 is a side cross-sectional view of an exemplary polymer member device incorporating aspects of the disclosed embodiments
Figure 3:
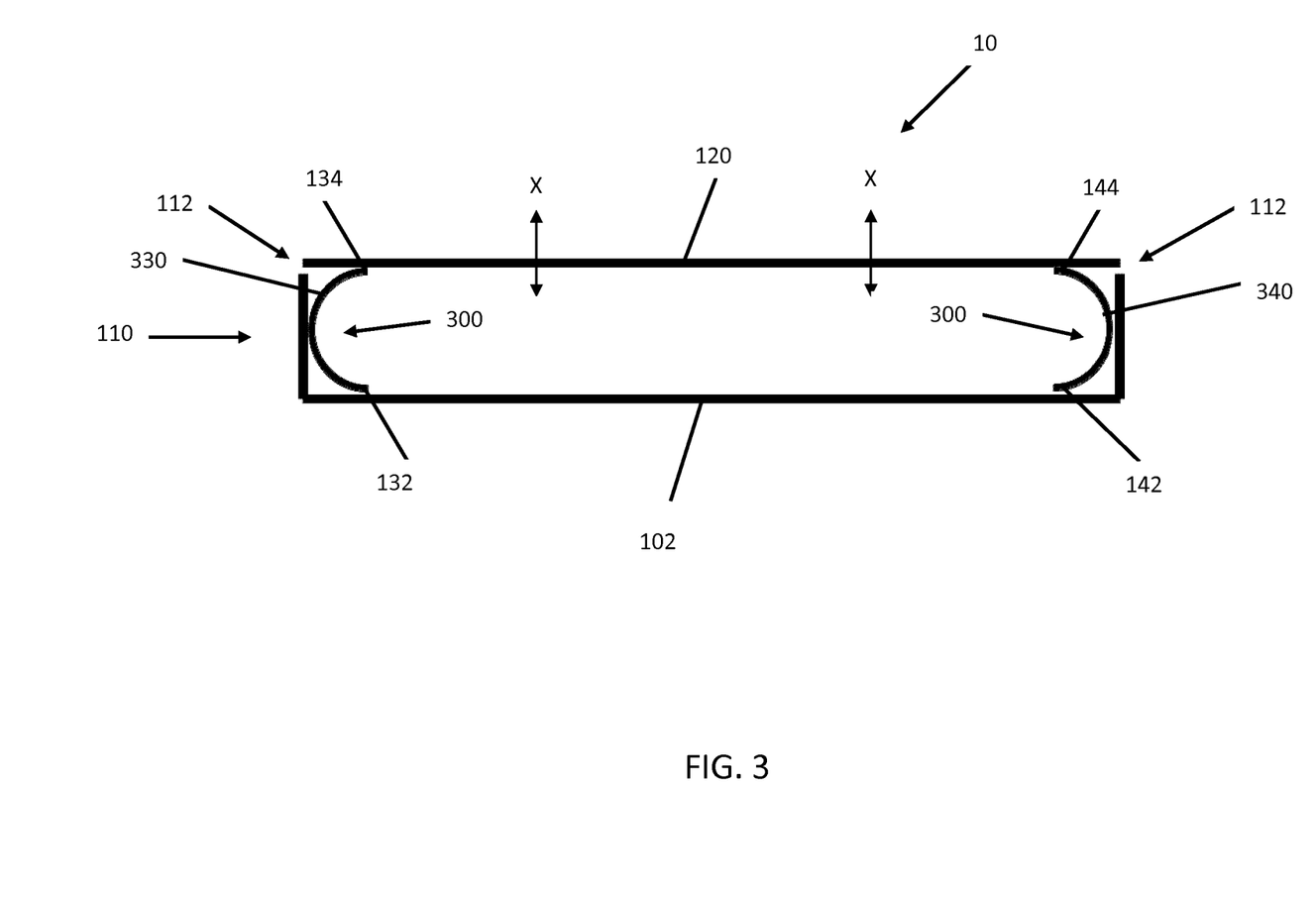
FIG. 3 is a front view of the exemplary apparatus of FIG. 1.

Referring also to FIGS. 2 and 3, in one embodiment, the apparatus 10 includes a first support member 102 and a second support member 120. The first support member 102 is part of or connected to the frame structure or assembly 110 of the apparatus 10. In one embodiment, the first support member 102 can comprise a printed circuit board (PCB) or similar structure that is secured to the frame assembly 110 of the apparatus 10.

The second support member 120 is generally disposed on a front of the apparatus 10 and is configured to be movable relative to the frame assembly 110 of the apparatus 10. In one embodiment, the second support member 120 comprises a display of the apparatus 10.

Referring to FIG. 2, the apparatus 10 includes one or more electro-active polymer members 300, also referred to herein as polymer devices 300. The one or more polymer devices 300 have a first end 312 and a second end 314. The first end 312 is configured to be affixed or connected to the first support member 102. The second end 314 is configured to be affixed or connected to the second support member 120.

The ends 312, 314 can be connected to the first support member 102 and the second support member 120, respectively, in any suitable manner. For example, in one embodiment, the ends 312, 314 of the polymer device 300 are glued to the respective first support member 102 and the second support member 120.

The middle portion 316 of the polymer device 300, between the first end 312 and the second end 314 is configured to be curved in a first state of the polymer device 300. As shown in FIG. 2, the curvature has a radius R1. In one embodiment, a radius R1 of the curvature of the middle portion is approximately 2 millimeters. In alternate embodiment, the radius R1 can be any suitable dimension based on the particular application and the size of the apparatus 10 and the display member.

In one embodiment, the middle portion 316 of the polymer device is disposed adjacent to a side member of the frame assembly 110, such as side members 111, 113, 115 or 117 illustrated in FIG. 1. While the polymer device 300 can be glued from both ends 312, 314, the middle portion 316 remains free or unsecured, to allow the polymer member 300 to change curvature and move the second support member 120 up and down. As shown in the example of FIG. 3, the one or more polymer members 300 are configured to cause the support member 120 to move in an up and down direction, illustrated by the reference arrows X. The use of the curved polymer member 300 allows the polymer members 300 to be disposed very close to one or more of the sides 111, 113, 115 and 117 of the apparatus 10. Eliminating the need for a separate speaker and being able to position the polymer members 300 close to the sides or edges 111-117 of the apparatus 10 is important in size critical devices such as mobile phones where the utilization of space is at a maximum.

The one or more polymer devices 300 generally comprise an electro-active polymer material. The polymer material is configured deform from an initial configuration in an initial state to a deformed configuration in a second state as a result of an applied electrical voltage. The electro-active polymer device 300 of the disclosed embodiments is generally driven with positive and negative voltage altering in the form of an audio signal. The positive and negative voltages and resulting mechanical movement of the polymer material are used to create symmetrical, non-distorted sound. In one embodiment, a push-pull amplifier is used to generate the needed audio signals. In alternate embodiments, any suitable amplifier can be used to provide the needed drive voltage. While the polymer device 300 may require a higher voltage, than traditional speakers, the required current will generally be less. Thus, the total power consumption of the one or more polymer devices 300 of the disclosed embodiments should be comparable to existing audio solutions for mobile communication devices.

As illustrated in the examples of FIGS. 2 and 3, in a first state of the one or more polymer devices 300, the middle portion 136 is curved or arched between the first support member 102 and the second support member 120. As will be generally described herein, the middle portion 136 in this first state is generally in the form if a half-circle with a radius R1. In accordance with the aspects of the disclosed embodiments, movement is created in the half-circle shaped polymer device 300 in order to move or vibrate the second support member 120. The second support member 120, such as a display glass for a mobile communication device, is configured to float relative to the first support member 102, and the frame assembly 110 of the apparatus 10. The curvature of the curved portion 316 can be adjusted by the electrical voltage that is applied to the polymer member 300. The adjustment or change in the curvature caused by changes in the electrical voltage results in movement or displacement of the second support member 120 relative to the frame assembly 110.

As is illustrated in FIG. 2, the polymer device 300 generally comprises a polymer layer 303. A first electrode layer 302 is disposed over and connected to a first side of the polymer layer 303. A second electrode layer 304 is disposed over and connected to a second side of the polymer layer 303. A first insulation layer 301 can be disposed over the first electrode layer 302 and a second insulation layer 305 can be disposed over the second electrode layer 304. The first electrode layer 302 and the second electrode layer 304 are configured to be connected to suitable sources of electrical power. As is generally understood, the application of an electrical potential to the polymer element or layer 303 will cause deformation of the polymer layer 303.

As is illustrated in FIG. 2, in one embodiment the polymer device 300 is pre-formed in the half-circle curved band shape. As an electrical potential is applied to the polymer device 300, such as an audio frequency alternating current (AC) voltage, the polymer device 300 will expand and contract. This expansion and contraction, or movement, is used to vibrate the second support member 120 to generate audio. The movement calculation is typically a 1% material volume change. Typical polymer materials are capable of a 4% volume expansion. Higher expansions require longer response times.

In the example of FIG. 2, the mechanical dimensions of the polymer device 300 include a height H1 of approximately 5 millimeters. A thickness T1 is approximately 0.5 millimeters. A radius R1 of the curved portion 316 of the device 300 is approximately 2 millimeters. A polymer element having a 2 millimeter bending radius and a 0.5 millimeter thickness will provide approximately 140 μm movement. This degree of movement is generally sufficient for sound reproduction in a mobile communication device. In alternate embodiments, the mechanical dimensions of the polymer device 300 can be adapted for the particular implementation and application.

The half-circle form of the polymer device 300 creates mechanical movement in an up and down or X direction, as illustrated in FIG. 3. For example, a positive voltage can cause the polymer device 300 to straighten, which pushes the second support member 120 upwards, away from the first support member 102. Application of a negative voltage to the polymer device 300 can cause the polymer device 300 to arch or curve more, which pulls the second support member 120 towards the first support member 102.

Figure 4:
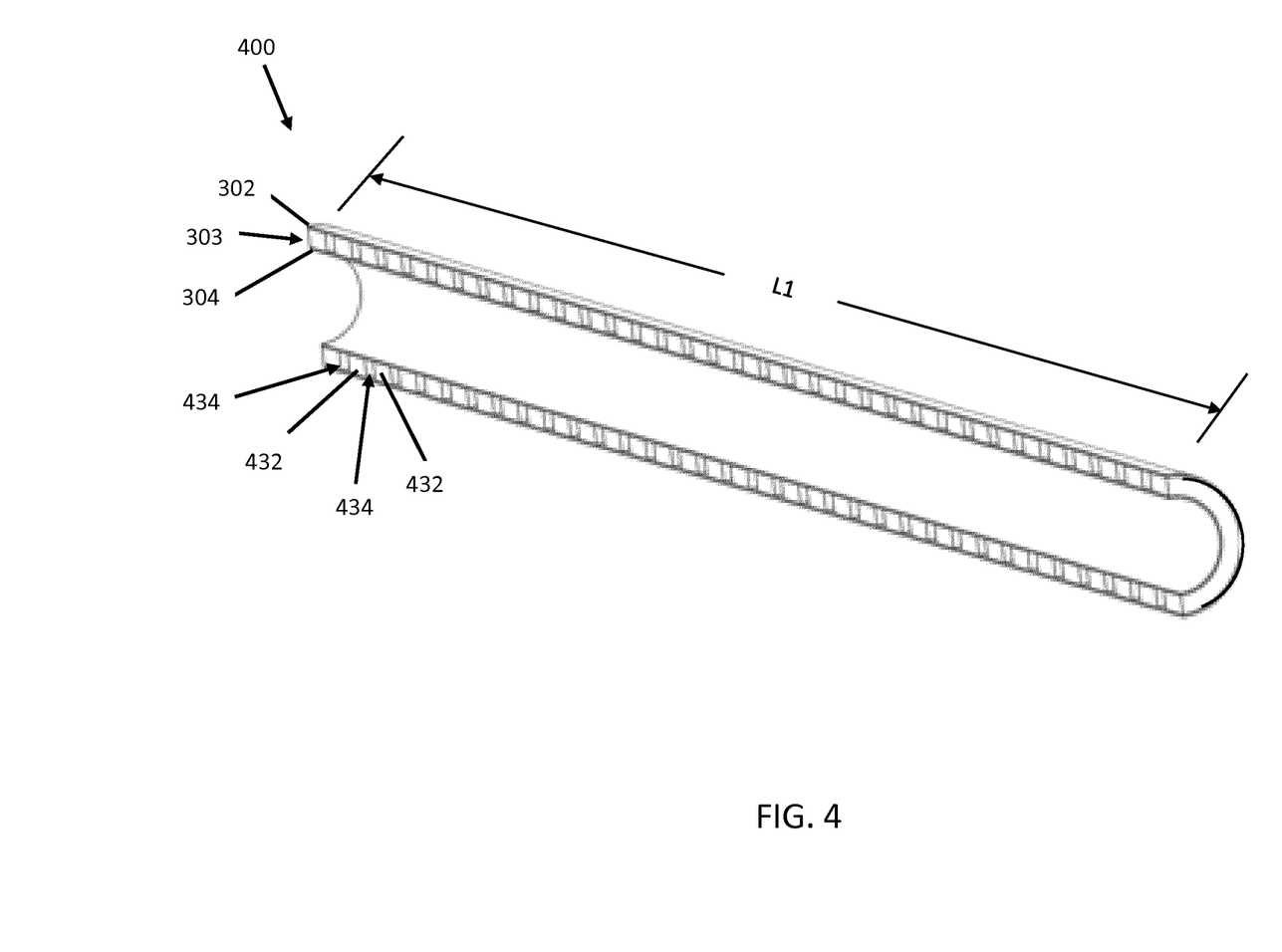
FIG. 4 is a perspective view of an exemplary polymer member device incorporating aspects of the disclosed embodiments.
Figure 5:
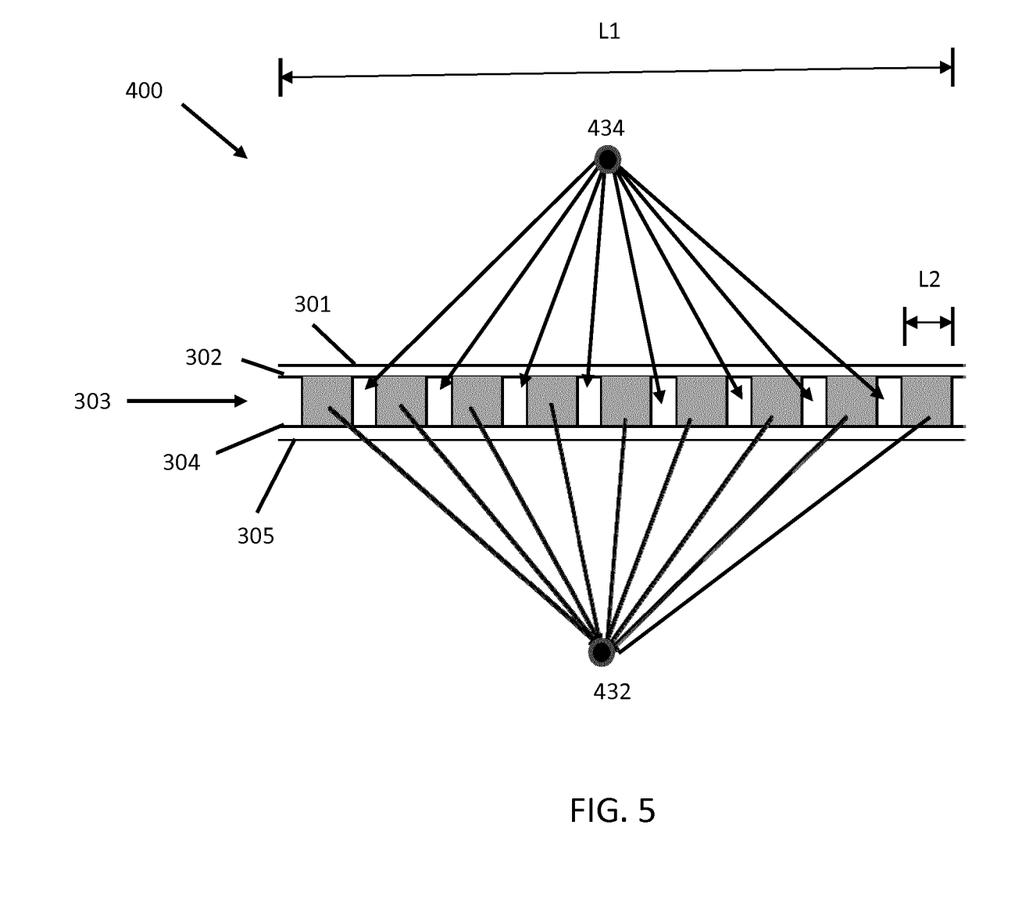
FIG. 5 is a front view of the exemplary polymer member device shown in FIG. 4 illustrating the air slits or gaps.
Figure 6:
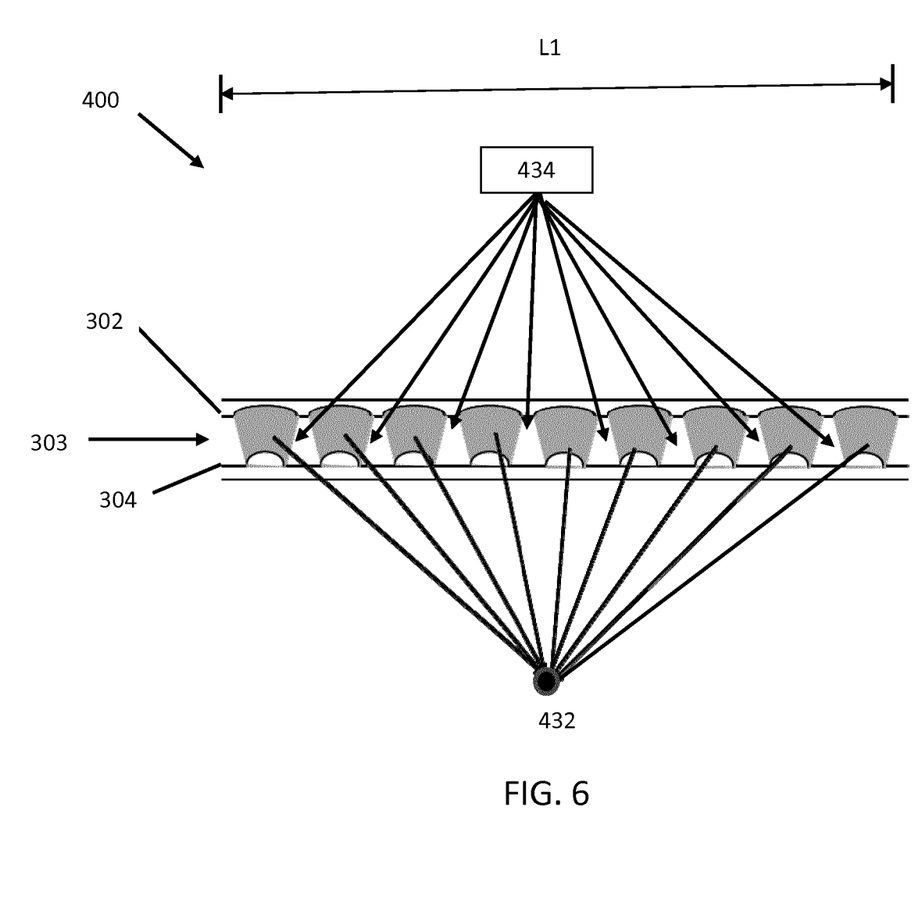
FIG. 6 illustrates the state of the exemplary polymer member device of FIG. 5 when a voltage is applied thereto.

Referring also to FIGS. 4-6, when an electrical potential is applied to the polymer layer 303 between the two electrode layers 302, 304, bending of the polymer device 300 can occur not only in the up and down or X direction, but also along a length or Y direction. Thus, if the polymer device 300 has a continuous length in the Y direction, the bending could also result in unwanted mechanical forces along the length of the polymer device 300.

In one embodiment, the unwanted mechanical forces in the Y or length direction can be minimized by splitting the polymer layer 303 into smaller, transverse portions, with air gaps between the portions. As illustrated in FIGS. 4 and 5, the smaller, transverse portions are created by incorporating slits or air gaps 434 between adjacent polymer member portions 432. In this manner, while each polymer layer 303 may bend in the length direction, the air gaps 434 are large enough to accommodate such movement and minimize any change in the overall length of the polymer device 300.

FIGS. 4 and 5 illustrate an exemplary polymer device 400 is formed from transverse polymer layer slices or portions 432 with air gaps 434 disposed between each of the transverse polymer portions 432. In this manner, when an electrical potential is applied to the individual polymer portions 432, while the length L2 of the individual transverse polymer portions 432 may change, the changes are absorbed or taken up in the air gaps 434. Thus, changes in the overall length L1 of the polymer device 400, and the resulting mechanical forces, will be minimized. The electrode layers 302, 304 and insulation layers 301, 305, maintain the mechanical structure of the polymer device 400 in this example.

The example of FIG. 5 shows the state of the polymer device 400 when a voltage is not applied. FIG. 6 illustrates the state of the polymer device 400 when a voltage is applied. In this example, it is shown how the individual polymer elements 432 may bend or arch when exposed to an electrical voltage. However, because of the air gaps or slits 434, the overall length L1 remains relatively unchanged.

While the example of FIG. 3 illustrates only a single polymer layer 303, the aspects of the disclosed embodiments are not so limited. In alternate embodiments, the polymer device 300 can include any suitable number of polymer layers 303, other than including one layer. Increasing the number of polymer layers 303 can increase the mechanical forces that can be applied to the second support member 120, as well as optimize response time, excursion, force and drive voltage, such as in an audio application.

Figure 7:
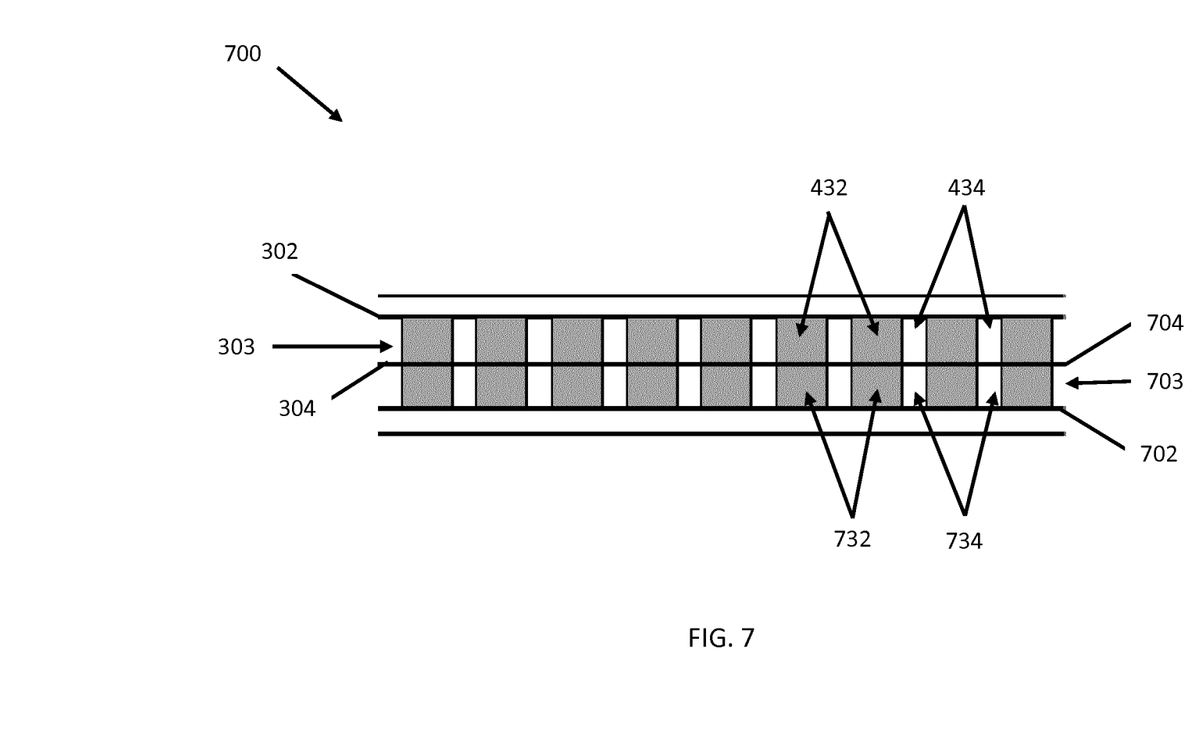
FIG. 7 is a front view of another exemplary polymer member device incorporating aspects of the disclosed embodiments.

FIG. 7 illustrates an exemplary polymer device 700 with more than one polymer layer incorporating aspects of the disclosed embodiments. In this example, rather than a single polymer layer 303 as shown in the example of FIG. 3, the polymer device 700 has two polymer layers 303, 703. Similar to the example shown in FIG. 5, the polymer layers 303, 703 are divided into separate, transverse polymer portions 432, 733, with air gaps 434, 734 respectively therebetween.

A first electrode 302 is disposed on in in electrical contact with one side of the polymer layer 303 and a second electrode 304 is disposed on and in electrical contact with the other side of the polymer layer 303. The second polymer layer 703 has a first electrode 702, also referred to herein as the third electrode, disposed on and in electrical contact with one side of the second polymer layer 703. The second polymer layer 703 has a second electrode 704 disposed on and in electrical contact with the other side of the second polymer layer 703. Corresponding insulation layers can be used to cover the outer electrodes 302 and 702, as needed.

In the example of FIG. 7, the second electrode 304 of the first polymer layer 303 and the second electrode 704 of the second polymer layer 704 are electrically connected together to form a common electrode, generally referred to herein as electrode 304. In one embodiment, the second electrode 304 and the second electrode 704 form a single electrode that is electrically connected to both the first polymer layer 303 and the second polymer layer 703. While only two polymer layers are illustrated in this example, the aspects of the disclosed embodiments are not so limited. The number of polymer layers can be any suitable number other than including two. Multiple polymer layers and corresponding electrode layer pairs can be used to apply higher forces as well as optimize bending response time, excursion, force and drive voltage for audio usage.

The aspects of the disclosed embodiments find particular application with mobile communication devices. FIG. 1 illustrates an apparatus 10 that can comprise a mobile communication device. In this example, the one or more polymer devices 300 include a left side polymer device 330, a right side polymer device 340, a top side polymer device 350 and a bottom side polymer device 360.

As shown in the example of FIG. 3, which is a cross-sectional view of the apparatus 10 taken along the line A-A, the left side polymer device 330 is connected at its first end 132 to the first support member 102. The first support member 102 is part of the frame assembly 110 in this example. The second end 134 of the left side polymer device 330 is connected to the second support member 120, such as a display of a mobile communication device.

With reference to the right side polymer device 340, the first end 142 is connected to the first support member 102 and the second end 144 is connected to the second support member 120. The connection process is similar to that described with respect to the left side polymer device 330. The top side polymer device 350 and bottom side polymer device 360 will also include similar connections to and between the first support member 102 and the second support member 120. Only the ends of each polymer device 330, 340, 350 and 360 are connected or secured. As otherwise described herein, the middle, or curved portion of each polymer device 330, 340, 350, 360 is free to move and change curvature as the audio electrical voltage is applied, which causes each polymer device 330, 340, 350, 360 to which the voltage is applied to pump up and down.

In the case of a mobile communication device, the second support member 120, referred to here as display 120, is configured to float relative to the frame assembly 110 and the first support member 102. As shown in the example of FIG. 3, an air gap 112 is formed between the display 120 and the frame assembly 110. The air gap 112 allows for movement and vibration of the display 120 relative to the frame assembly 110.

Generally, the first support member 102 will be part of the frame assembly 110 or connected to the frame assembly 110. The polymer devices 330, 340, 350, 360 in this example work as a suspension between the frame assembly 110 and the display 120, and allow the display 120 to move up and down. When an electrical audio signal is applied to one or more of the polymer devices 330, 340, 350, 360 shown in FIG. 1, the display glass 120 will vibrate to produce an acoustical sound.

The polymer device 300 can generally extend around a circumference of the apparatus 10, where the polymer element 303 is flexible enough. In some cases, gaps must be provided in the polymer element 300 to allow for areas such as corners of the mobile device, volume keys and SIM card implementation, for example. In these implementations, the polymer devices 300 will be placed on either side of such gaps. To provide non-distorted audio, generally the different polymer devices 300 should be arranged in a symmetrical manner around the circumference of the frame assembly 10.

For example, referring to FIG. 1, the polymer member 300 does not extend in a continuous manner all the way around a circumference of the apparatus 10. In this example, seals 11, 13, 15 and 17 are disposed in the corners of the frame assembly 110 of the apparatus 10. The seals 11, 13, 15, 17 can be used to retain the polymer members 330, 340, 350 and 360 in their respective positions as well as provide protection against environmental factors, such as dust and water or other liquids. In one embodiment, the seals 11, 13, 15 and 17 comprise a rubber or other suitable material.

Figure 8:
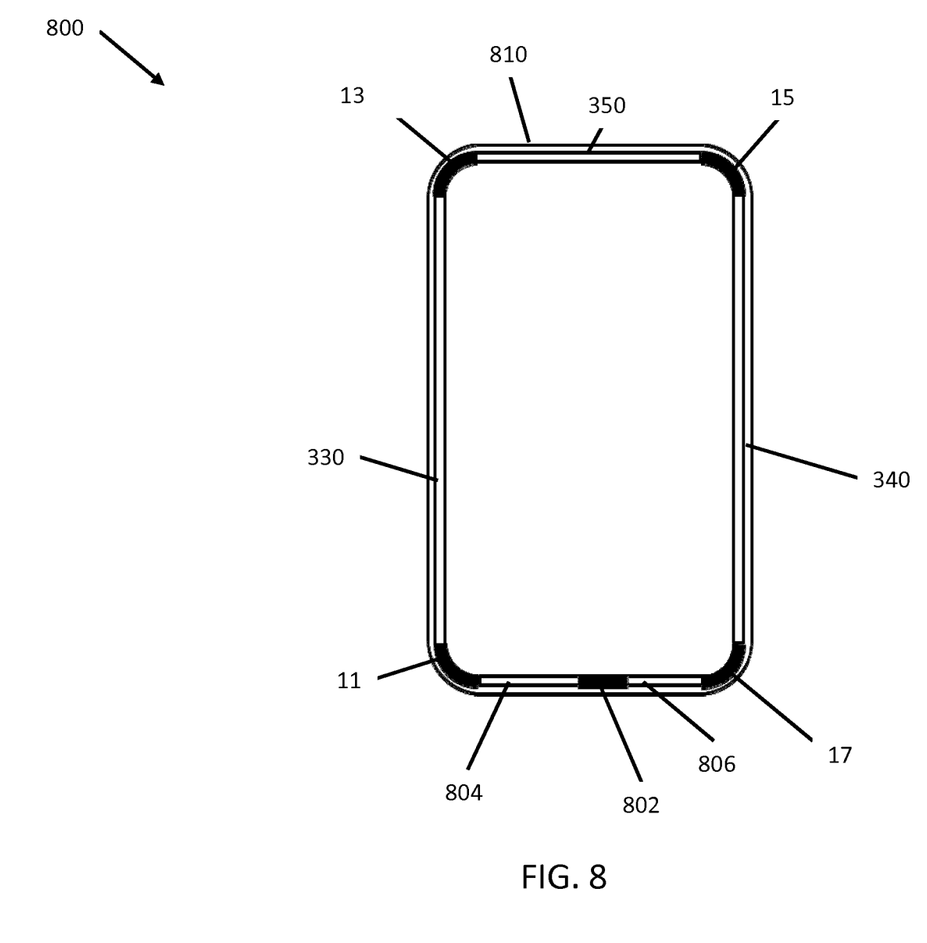
FIG. 8 is a front view of an exemplary apparatus incorporating aspects of the disclosed embodiments.

FIG. 8 illustrates another example of a mobile communication device 800 incorporating aspects of the disclosed embodiments. In this example, an additional seal 802 is provided to allow for implementation of a USB connector. As shown in FIG. 8, the bottom side polymer device 360 of FIG. 1 is divided into two parts and comprises a first bottom side polymer device 804 and a second bottom side polymer device 806. The first bottom side polymer device 804 and the second bottom side polymer device 806 are substantially symmetrically arranged along the bottom of the device relative to the seal 802. Dividing the polymer element into more than one part does not affect audio performance as long as the total amount of polymer integration area is sufficient to reach the needed efficiency and the polymer integration around the display 120 is symmetrical to cause linear displacement of the display 120.

In one embodiment, referring also to FIG. 8, an antenna 810 for the apparatus 10 can be located in the main body of the apparatus 10, but outside of the top side polymer device 350. The antenna 810 can be connected to the printed wiring board (PWB) of the apparatus 10 in any suitable, such as for example, a flex on board connection.

In the example of FIG. 8, in one embodiment, the top side polymer device 350 can be used alone to act as the speaker or earpiece when the apparatus 10 is positioned against the user's ear. Vibrating the entire area of the second support member 120, or display glass in this example, could cause poor audio as well as limit the privacy of the generated audio. By limiting the audio to the top side polymer device 350, the generated sound is directed to the user's ear and energy consumption is improved. When used in a speaker mode, all of the polymer devices 330, 340, 350 and 360 can be used to maximize acoustical output.

Figure 9:
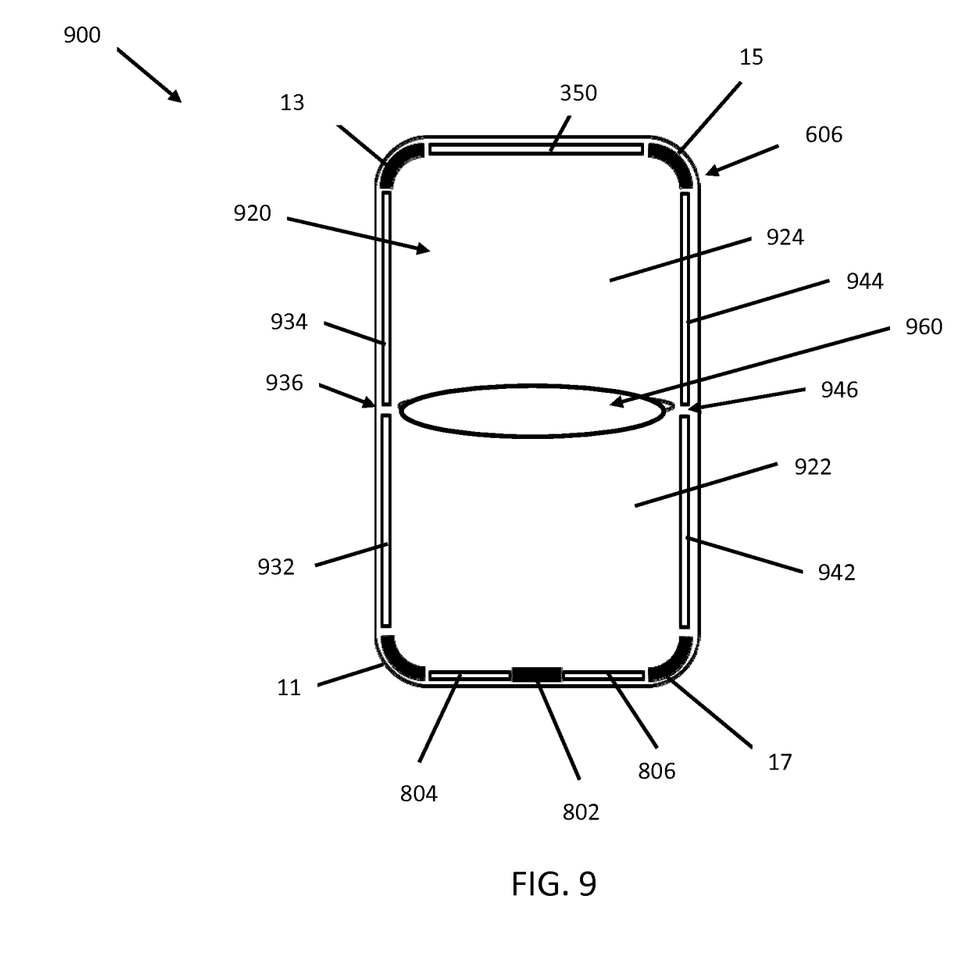
FIG. 9 is a front view of another exemplary apparatus incorporating aspects of the disclosed embodiments.

In one embodiment, the one or more polymer devices 300 can be used to provide a stereo sound implementation. Referring to FIG. 9, in this embodiment, the left side polymer device 330 of the mobile communication device 900 is divided into a first left side polymer device 932 and a second left side polymer device 934. The first left side polymer device 932 and the second left side polymer device 934 could also be referred to as lower and upper left side polymer devices, respectively. A gap 936 is disposed between the first left side polymer device 932 and the second left side polymer device 934.

In a similar manner, on the right side of the mobile communication device 900, the right side polymer device 340 is divided into a first or lower right side polymer device 942 and a second or upper right side polymer device 944. A gap 946 is disposed between the first right side polymer device 942 and the second right side polymer device 944.

In this example, the display structure 920 of the mobile communication device 900 is configured to bend about the area generally shown as 960. The area 960 is generally aligned between the left side gap 936 and the right side gap 946. In one embodiment, the area 960 of the display structure 920 is a flexible area that forms an elastic hinge that allows bending of the display structure 920. The display structure 920 in this example generally comprises a plastic material. In this manner, the area 922 below the hinge area 960 can vibrate independently of the area 924 above the hinge area 960. By dividing the display structure 920 into the at least two areas 922, 924 a stereo implementation can be realized.

The aspects of the disclosed embodiments are directed to an audio display with a polymer device that includes an electro-active polymer element. The polymer device has a half rounded or curved shape and creates linear up and down movement by bending in the direction of the curve. Air gaps between polymer elements minimize changes in the length direction. The expansion and contraction of the curved polymer element generates and up and down movement of the display that is connected to the end of the polymer device not attached to the frame. The up and down movement, or vibration, is used to generate acoustical sound. Suitable amplifiers and driver circuits are used to create the acoustical voltages to drive the polymer elements.

When implemented as an audio display product for a mobile communication device, several benefits are realized. The device does not require sound holes, which are otherwise needed for speakers. Holes make the device vulnerable to environmental factors such as dust and water. There is no need for receiver sound holes in the front face of the device, which enables a wider active display area. Also, since the generated sound comes from the display, the sound is pointed towards the user, rather than to the side areas of the phone, which is the common practice.

Further, the aspects of the disclosed embodiments provide benefits for improved product durability. For example, in the case of a mobile communication device, the flexible nature of the polymer material and device can provide additional dust and water tolerance.

The display glass of a mobile communication device is one of the most vulnerable areas to breakage when dropped or subject to impact or other mechanical forces. According to the aspects of the disclosed embodiments, the display glass floats relative to the frame assembly. Thus, the display glass can withstand more forces, such as when dropped.

Thus, while there have been shown, described and pointed out, fundamental novel features of the invention as applied to the exemplary embodiments thereof, it will be understood that various omissions, substitutions and changes in the form and details of devices and methods illustrated, and in their operation, may be made by those skilled in the art without departing from the spirit and scope of the presently disclosed invention. Further, it is expressly intended that all combinations of those elements, which perform substantially the same function in substantially the same way to achieve the same results, are within the scope of the invention. Moreover, it should be recognized that structures and/or elements shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto

What is claimed is:

1. An apparatus comprising:
   a front;
   a first support member;
   a second support member disposed on the front and facing the first support member;
   one or more electro-active polymer members disposed between the first support member and the second support member and around a circumference of the first support member and the second support member, wherein each electro-active polymer member comprises:
     a first end connected to the first support member;
     a second end connected to the second support member; and
     a middle portion located between the first end and the second end and comprising a curved member that is unsecured in a first state of the electro-active polymer member, wherein the curved member is configured to cause a respective electro-active polymer member to move the second support member when an electrical voltage is applied to the respective electro-active polymer member; and
   a frame assembly extending around a perimeter of the apparatus, wherein the one or more electro-active polymer members are disposed adjacent to one or more sides of the frame assembly, and wherein the curved member of the middle portion of each electro-active polymer member is disposed adjacent to the one or more sides of the frame assembly around the circumference of the first support member and the second support member.

2. The apparatus of claim 1, wherein the second support member comprises a display member.

3. The apparatus of claim 1, wherein the one or more electro-active polymer members further comprise a first polymer layer, and wherein the first polymer layer comprises first adjacent polymer sections and a first slit located between the first adjacent polymer sections.

4. The apparatus of claim 3, wherein each electro-active polymer member further comprises a first electrode layer and a second electrode layer, and wherein the first polymer layer is disposed between the first electrode layer and the second electrode layer.

5. The apparatus of claim 4, wherein each electro-active member further comprises a second polymer layer disposed adjacent to the first polymer layer, and wherein the second polymer layer comprises second adjacent polymer sections and a second slit located between the second adjacent polymer sections.

6. The apparatus of claim 5, wherein the second polymer layer comprises:
   a third electrode layer coupled to the first electrode layer; and
   a fourth electrode layer coupled to the second electrode layer.

7. The apparatus of claim 5, wherein one of the first adjacent polymer sections is aligned with one of the second adjacent polymer sections.

8. The apparatus of claim 1 further comprising a gap, wherein the gap is disposed between the frame assembly and the second support member.

9. The apparatus of claim 1, wherein each electro-active polymer member is configured to cause the second support member to move in a first direction in a second state of the one or more electro-active polymer members.

10. The apparatus of claim 1, wherein each electro-active polymer member further comprises:
    a first electro-active polymer member disposed along a first side of the frame assembly;
    a second electro-active polymer member disposed along a second side of the frame assembly;
    a third electro-active polymer member disposed along a top side of the frame assembly; and
    a fourth electro-active polymer member disposed along a bottom side of the frame assembly.

11. The apparatus of claim 10, wherein the first electro-active polymer member comprises:
    a first lower electro-active polymer member;
    a first upper electro-active polymer member; and
    a first gap located between the first lower electro-active polymer member and the first upper electro-active polymer member, and
    wherein the second electro-active polymer member comprises:
      a second lower electro-active polymer member;
      a second upper electro-active polymer member; and
      a second gap located between the second lower electro-active polymer member and the second upper electro-active polymer member.

12. The apparatus of claim 11, wherein the first lower electro-active polymer member and the first upper electro-active polymer member are symmetrically arranged with the second lower electro-active polymer member and the second upper electro-active polymer member.

13. The apparatus of claim 1, wherein the apparatus is a mobile communication device.

14. A method of generating audio in a device comprising:
    connecting at least one electro-active polymer member between a first support member and a second support member of the device, wherein the second support member is disposed on a front of the device and facing the first support member, and wherein the at least one electro-active polymer member is disposed around a circumference of the first support member and the second support member; and
    electrically activating and deactivating the at least one electro-active polymer member to generate an audio and to move the second support member when an electrical voltage is applied to the electro-active polymer member, wherein each electro-active polymer member comprises:
      a first end connected to the first support member;

a second end connected to the second support member; and a middle portion located between the first end and the second end and comprising a curved member that is unsecured in a first state of the electro-active polymer member, wherein the curved member is configured to cause a respective electro-active polymer member to move the second support member when the electrical voltage is applied to the respective electro-active polymer member, wherein the device comprises a frame assembly extending around a perimeter of the device, and wherein the curved member of the middle portion of each electro-active polymer member is disposed adjacent to one or more sides of the frame assembly around the circumference of the first support member and the second support member.

15. The method of claim 14, wherein the at least one electro-active polymer member comprises:

a first electro-active polymer member disposed adjacent to a first side of the device;

a second electro-active polymer member disposed on a second side of the device;

a third electro-active polymer member disposed along a top side of the device; and a fourth electro-active polymer member disposed along a bottom side of the device, and wherein the method further comprises selectively activating one or more of the first electro-active polymer member, the second electro-active polymer member, the third electro-active polymer member, and the fourth electro-active polymer member to generate the audio.

16. The method of claim 14, wherein the first support member is secured to the frame assembly.

17. The method of claim 14, wherein electrically activating and deactivating the at least one electro-active polymer member comprises moving the second support member in a direction perpendicular to the front of the device.

18. The apparatus of claim 1, wherein the second support member is configured to move in a direction perpendicular to the front of the apparatus.

19. The method of claim 14, wherein electrically activating and deactivating the at least one electro-active polymer member causes the at least one electro-active polymer to deform from an initial configuration in an initial state to a deformed configuration in a second state resulting in a mechanical movement that creates symmetrical and non-distorted sound.

20. The method of claim 14, wherein electrically activating and deactivating the at least one electro-active polymer member comprises causes a change in the curved member of the middle portion of the at least one electro-active polymer resulting in movement of the second support member relative to the frame assembly.

* * * * *